(12) United States Patent
Ogasawara et al.

(10) Patent No.: US 9,508,964 B2
(45) Date of Patent: Nov. 29, 2016

(54) STRUCTURE FOR HOLDING VOLTAGE DETECTING TERMINAL

(71) Applicant: YAZAKI CORPORATION, Tokyo (JP)

(72) Inventors: Shigeyuki Ogasawara, Kakegawa (JP); Shinichi Yanagihara, Kakegawa (JP); Michio Ota, Kakegawa (JP)

(73) Assignee: YAZAKI CORPORATION, Tokyo (JP)

(*) Notice: Subject to any disclaimer, the term of this patent is extended or adjusted under 35 U.S.C. 154(b) by 132 days.

(21) Appl. No.: 14/560,349

(22) Filed: Dec. 4, 2014

(65) Prior Publication Data

US 2015/0086819 A1    Mar. 26, 2015

Related U.S. Application Data

(63) Continuation of application No. PCT/JP2013/073206, filed on Aug. 29, 2013.

(30) Foreign Application Priority Data

Aug. 30, 2012 (JP) .................. 2012-189898

(51) Int. Cl.
*H01M 2/10* (2006.01)
*H01M 2/20* (2006.01)
(Continued)

(52) U.S. Cl.
CPC ............ *H01M 2/10* (2013.01); *H01M 2/1072* (2013.01); *H01M 2/20* (2013.01); *H01M 2/206* (2013.01); *H01M 10/48* (2013.01); *G01R 31/3696* (2013.01)

(58) Field of Classification Search
CPC .......... H01M 2/10; H01M 2/20; H01M 2/06; H01M 2/1072; H01M 10/48; G01R 31/3696
See application file for complete search history.

(56) References Cited

U.S. PATENT DOCUMENTS

| 2002/0098734 A1* | 7/2002 | Ikeda .................. H01M 2/1077 439/500 |
| 2011/0008669 A1 | 1/2011 | Ogasawara et al. |
| 2012/0231640 A1 | 9/2012 | Ikeda et al. |

FOREIGN PATENT DOCUMENTS

| JP | 2011-018499 A | 1/2011 |
| JP | 2011-049047 A | 3/2011 |

(Continued)

OTHER PUBLICATIONS

International Search Report for PCT/JP2013/073206 dated Oct. 8, 2013 [PCT/ISA/210].

(Continued)

*Primary Examiner* — Patrick Ryan
*Assistant Examiner* — Aaron Greso
(74) *Attorney, Agent, or Firm* — Sughrue Mion, PLLC

(57) ABSTRACT

A voltage detecting terminal includes a flat plate-shaped electric contact portion having an insertion hole into which an electrode column of a battery is inserted, and a bent portion formed such that a tip is bent upward with respect to the electric contact portion. The bent portion is provided with a holding portion, and both ends of the holding portion in a plate width direction are expanded in the plate width direction, respectively. The voltage detecting terminal has a lower end surface of the holding portion in a thickness direction abutting against supporting surfaces of the plate and is held by a first housing portion.

8 Claims, 3 Drawing Sheets

(51) Int. Cl.
*H01M 10/48* (2006.01)
*G01R 31/36* (2006.01)

(56) References Cited

FOREIGN PATENT DOCUMENTS

| | | |
|---|---|---|
| JP | 2012-059663 A | 3/2012 |
| JP | 2012-248513 A | 12/2012 |
| JP | 2013-143181 A | 7/2013 |
| JP | 2013-143281 A | 7/2013 |
| WO | 2011/043261 A1 | 4/2011 |
| WO | 2012/053581 A1 | 4/2012 |
| WO | 2013/005515 A1 | 1/2013 |
| WO | 2013/011756 A1 | 1/2013 |
| WO | 2013/080780 A1 | 6/2013 |

OTHER PUBLICATIONS

Written Opinion for PCT/JP2013/073206 dated Oct. 8, 2013 [PCT/ISA/237].
Communication issued on Oct. 8, 2013 by the International Searching Authority in related application No. PCT/JP2013/073206.
Communication issued Jun. 28, 2016, issued by the Japanese Patent Office in counterpart Japanese Patent Application No. 2012-189898.

* cited by examiner

STRUCTURE FOR HOLDING VOLTAGE DETECTING TERMINAL

CROSS REFERENCE TO RELATED APPLICATIONS

This application is a continuation of PCT application No. PCT/JP13/073,206, which was filed on Aug. 29, 2013 based on Japanese Patent Application (No. 2012-189898) filed on Aug. 30, 2012, the contents of which are incorporated herein by reference.

BACKGROUND OF THE INVENTION

1. Field of the Invention

The present invention relates to a structure for holding a voltage detecting terminal.

2. Description of the Related Art

A power supply device that connects a plurality of batteries in series is mounted on motors, such as a hybrid car and an electric car. In this type of power supply device, a busbar module is mounted on a plurality of batteries (hereinafter referred to as a battery assembly) in which electrode columns of a positive electrode and a negative electrode are alternately arrayed and superimposed, and the respective batteries are connected in series. The busbar module includes a plurality of busbars each of which electrically connects a positive electrode and a negative electrode of the batteries adjacent to each other, a plurality of voltage detecting terminals each of which is connected to each busbar and detects the voltage of each battery, a plurality of electric wires (voltage detecting wires) connected to the voltage detecting terminals, respectively, and a plate made of insulating resin that holds the busbars and the voltage detecting terminals (refer to PTL 1).

The busbar includes a plate material made of conductive metal, and is provided with a pair of insertion holes that allow an electrode column as the positive electrode and an electrode column as the negative electrode in the batteries adjacent to each other to pass therethrough, respectively. The voltage detecting terminal has an electric contact portion that detects the voltage of a battery in contact with the busbar, and a crimping portion that is connected to the electric contact portion and has an electric wire crimped thereat. The electric contact portion includes a plate material made of conductive metal, and is provided with an insertion hole that allows one of the two electrode columns, to which the busbar is connected, to pass therethrough.

The plate is integrally formed with a plurality of first housing portions that are formed in conformity with the size of the battery assembly as a whole and houses the busbars and the electric contact portions of the voltage detecting terminals, a coupling portion that couples the first housing portions adjacent to each other, and a second housing portion that is connected to a first housing portion and houses the crimping portion of each voltage detecting terminal.

The power supply device configured in this way is assembled as follows. First, the busbar is housed in the first housing portion of the plate, and the busbar is held by the first housing portion. Subsequently, as for the voltage detecting terminal, the electric contact portion is superimposed on and held by the busbar of the first housing portion, and the crimping portion is housed in the second housing portion.

If the plate to which the busbar and the voltage detecting terminal are attached in this way is mounted on the battery assembly, the electrode columns of the positive electrode and the negative electrode are respectively inserted into the pair of insertion holes of the busbar, and one electrode column passed through the insertion hole is inserted into the insertion hole of the electric contact portion of the voltage detecting terminal. Accordingly, one end surface of the busbar is arranged in contact with the two electrode columns, respectively, and the other end surface of the busbar is arranged in contact with the electric contact portion of the voltage detecting terminal. Then, as a nut is screwed along a groove formed in each electrode column, the busbar and the voltage detecting terminal are electrically connected to the pair of electrode columns, respectively.

Meanwhile, as illustrated in FIG. 5, a plate-shaped holding portion 107, which is connected to an electric contact portion 105 and extends in a planar direction, is provided at a related-art voltage detecting terminal 101, in addition to a crimping portion 103. As illustrated in FIG. 6, as the holding portion 107 abuts against a supporting surface 113 formed in a plate 109 and the crimping portion 103 is housed in a second housing portion 115, the voltage detecting terminal 101 is held by the plate 109 in order to be held by a first housing portion 111 of the plate 109.

[PTL 1] JP-A-2011-18499

SUMMARY OF THE INVENTION

However, in a structure for holding this type of voltage detecting terminal 101, a space for the supporting surface for making the holding portion 107 abut on the plate 109 should be secured, and there is a concern that the degree of freedom in the design of the plate 109 may be decreased. Additionally, since the plate 109 becomes large by providing the supporting surface 113 in the plate 109, an increase of part costs accompanying an increase in the amount of resin to be used poses a problem.

The invention has been made in view of such a situation, and an object thereof is to provide a structure for holding a voltage detecting terminal that can downsize a plate and can reduce part costs.

The above object related to the invention is achieved by the following configurations.

(1) A structure for holding a voltage detecting terminal in which a voltage detecting terminal measuring the voltage of each battery is held by a housing portion of a plate made of resin in which busbars connecting a plurality of batteries in series are housed, wherein the voltage detecting terminal includes a flat plate-shaped electric contact portion having an insertion hole into which an electrode column of the battery is inserted, and is electrically connected to the electrode column, and a plate-shaped bent portion formed such that a tip protruding so as to be connected to the electric contact portion is bent upward with respect to the electric contact portion, wherein the bent portion is provided with a holding portion, both ends of the holding portion in a plate width direction are expanded in the plate width direction, respectively, and wherein the voltage detecting terminal has a lower end surface of the holding portion in a thickness direction thereof abutting against a supporting surface of the plate and is held by the housing portion.

According to the structure for holding a voltage detecting terminal of the configuration of the above (1), the supporting surface of the plate may support a plate thickness portion in the holding portion of the voltage detecting terminal. Thus, for example, compared to the case where the holding portion, which is connected to the electric contact portion of the voltage detecting terminal and extends in the planar direction, is supported, the area of the supporting surface can be made small. Also, since the area of the supporting surface becomes small and consequently, the overall plate can be made small, the amount of resin to be used for the plate can be reduced and part costs can be reduced.

(2) The structure for holding a voltage detecting terminal of the configuration of the above (1), wherein the holding portion is housed within a space formed between the supporting surface and a pair of lateral walls that rise parallel to each other with the supporting surface therebetween.

According to the configuration of the above (2), since the voltage detecting terminal can be supported in a rising direction of the holding portion, the voltage detecting terminal can be more stably held.

(3) The structure for holding a voltage detecting terminal of the configuration of the above (1) or (2), wherein the bent portion is formed by being bent substantially at a right angle with respect to the electric contact portion.

According to the configuration of the above (3), as the bent portion is formed by being bent substantially at a right angle, a shape holding force of the voltage detecting terminal held by the plate can be increased. Thus, the voltage detecting terminal can be more stably held.

DETAILED DESCRIPTION OF THE EXEMPLARY EMBODIMENTS

Hereinafter, an embodiment of a structure for holding a voltage detecting terminal related to the invention will be described with reference to the drawings. The structure for holding a voltage detecting terminal of the present embodiment is applied to, for example, a power supply device that is mounted on an electric car traveling with the driving force of a motor, a hybrid car traveling with the driving forces of both of an engine and a motor, or the like, and supplies electric power to the motor.

The power supply device of the present embodiment includes a battery assembly (not illustrated) and a busbar module to be described below. The battery assembly is configured, for example, by superimposing a plurality of batteries formed in the shape of a rectangular parallelepiped on each other. A pair of columnar electrode columns are provided so as to protrude from an electrode surface of each battery, one electrode column of these electrode columns is an electrode column (hereinafter, referred to as a positive electrode column) that is a positive electrode, and the other electrode column is an electrode column (hereinafter, referred to as a negative electrode column) that is a negative electrode. The plurality of batteries are superimposed on each other so that the positive electrode column and the negative electrode column alternate between the batteries adjacent to each other. The respective batteries are connected in series by mounting the busbar module on the electrode surface of the battery assembly configured in this way.

Figure 1:
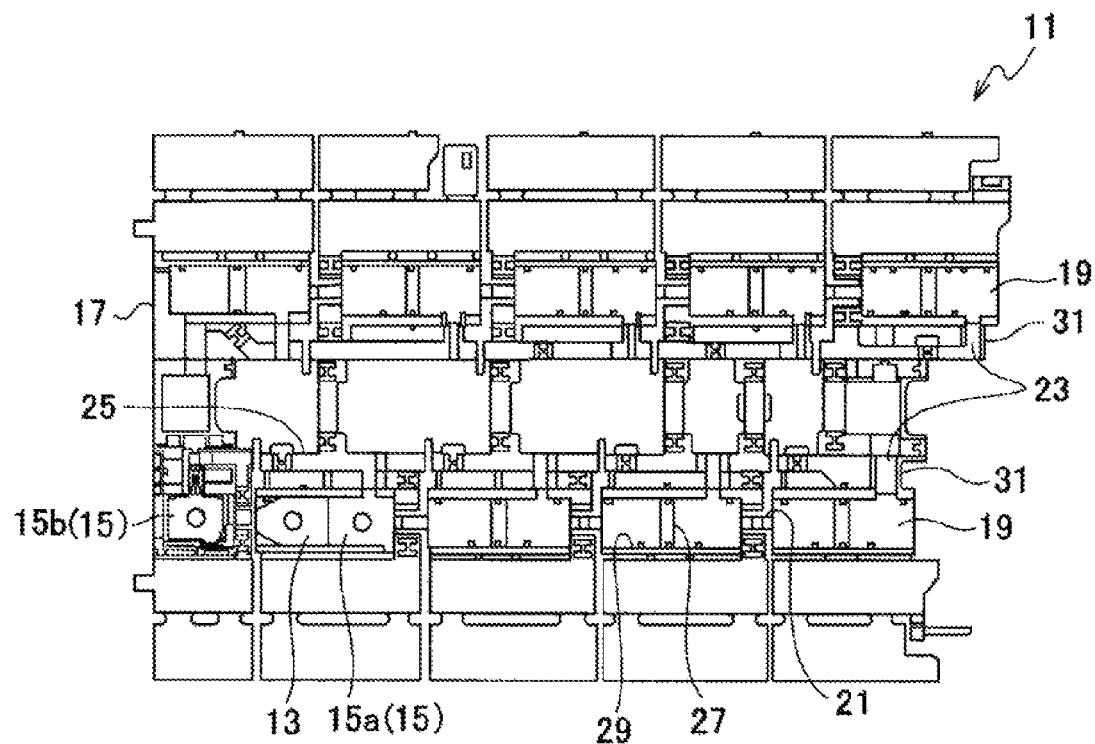
FIG. 1 is a top view of a busbar module to which a structure for holding a voltage detecting terminal related to an embodiment of the invention is applied.

As illustrated in FIG. 1, the busbar module 11 is a planar shape as a whole, and is formed in a substantially rectangular shape in conformity with the electrode surface of the battery assembly. The busbar module 11 includes a plurality of busbars 13 each of which electrically connects the positive electrode column and the negative electrode column between the batteries of the battery assembly adjacent to each other, a plurality of voltage detecting terminals 15 each of which detects the voltage of each battery, and a plate 17 made of insulating resin that holds the busbars 13 and the voltage detecting terminals 15.

The busbar 13 is a plate material made of conductive metal, and is provided with a pair of insertion holes that allow the positive electrode column and the negative electrode column of the batteries adjacent to each other to pass therethrough, respectively.

The plate 17 integrally includes a plurality of first housing portions 19 that hold the busbars 13 and the voltage detecting terminals 15, a coupling portion 21 that couples the first housing portions 19 adjacent to each other together, a second housing portion 23 that is formed so as to be connected to a first housing portion 19, and an electric wire housing groove 25 that bundles and houses electric wires connected to the voltage detecting terminals 15, or the like. In addition, in order to make the configuration easily understood, an example in which a busbar 13 and a voltage detecting terminal 15a (15) are housed in a first housing portion 19 and superimposed on each other and an example in which a voltage detecting terminal 15b (15) is independently housed are illustrated in one place each, in FIG. 1, and the other busbars 13 and the other voltage detecting terminals 15 are omitted.

As illustrated in FIG. 1, the first housing portions 19 are arranged along a longitudinal direction (left-and-right direction of FIG. 1) of the plate 17. Additionally, two rows in each of which the plurality of first housing portions 19 are arranged are provided at an interval from each other along a width direction (vertical direction of FIG. 1) of the plate 17. The first housing portion 19 is formed inside a bottom wall 27 of the plate 17, and a first surrounding wall 29 is erected so as to surround the bottom wall 27. The second housing portion 23 is formed along the width direction of the plate 17, and is formed inside a pair of second surrounding walls 31 that are erected at an interval from each other.

Next, a structure for holding a voltage detecting terminal 15 serving as a characteristic component of the present embodiment will be described with reference to FIGS. 2 to 4. Here, the structure for holding the voltage detecting terminal 15 means a structure for holding the voltage detecting terminal 15 in the first housing portion 19 of the plate 17.

Figure 2:
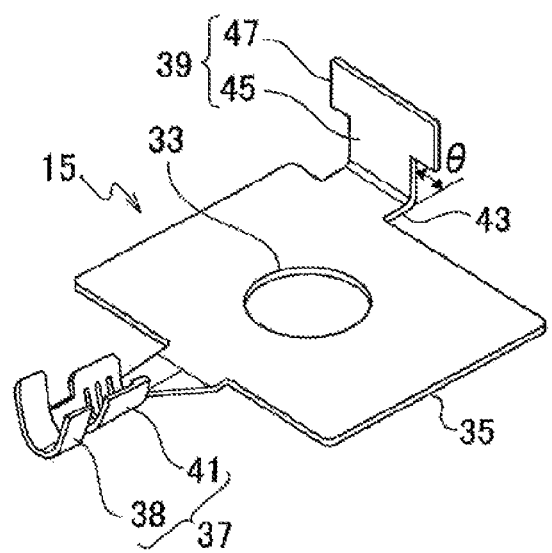
FIG. 2 is a perspective view of a voltage detecting terminal to which the structure for holding a voltage detecting terminal related to the embodiment of the invention is applied.

As illustrated in FIG. 2, the voltage detecting terminal 15 includes an electric contact portion 35 that has an insertion hole 33 that allows the positive electrode column or the negative electrode column of a battery to pass therethrough and is electrically connected to these electrode columns, a crimping portion 37 that is connected to the electric contact portion 35 and has an electric wire (not illustrated) crimped thereat, and a plate-shaped bent portion 39 that is connected to the electric contact portion 35 and of which a protruding tip is formed so as to be bent upward (upward direction of FIG. 2).

The electric contact portion 35 is formed in the shape of a rectangular flat plate, is superimposed on a busbar 13 and is formed with a size such that the electric contact portion 35 can be housed in a first housing portion 19. The crimping portion 37 is configured to include a fixing piece 38 and a crimping piece 41, fixes an electric wire with the fixing piece 38 so as to wrap the electric wire, and crimps the electric wire in the fixed state so as to wrap the electric wire with the crimping piece 41.

The bent portion 39 is formed such that a tip of an overhanging portion 43 extending on the same plane as the electric contact portion 35 from a side surface of the electric contact portion 35 in a thickness direction is bent and formed substantially at a right angle to the electric contact portion 35. The bent portion 39 is formed so as to be connected to the overhanging portion 43, a trunk portion 45 having the same plate width as the plate width of the overhanging portion 43 is provided on a base end side (lower side of FIG. 2), and a holding portion 47 formed such that both ends of the trunk portion 45 in a plate width direction are expanded in the plate width direction, respectively, is provided on a tip side (upper side of FIG. 2). The holding portion 47 is provided so as to extend in a direction substantially orthogonal to a direction in which both side surfaces of the trunk portion 45 in a thickness direction extend, and the bent portion 39 is formed in a T shape as a whole.

Next, the configuration of the plate 17 that holds the voltage detecting terminal 15 will be described with reference to FIGS. 3 and 4.

Figure 3:
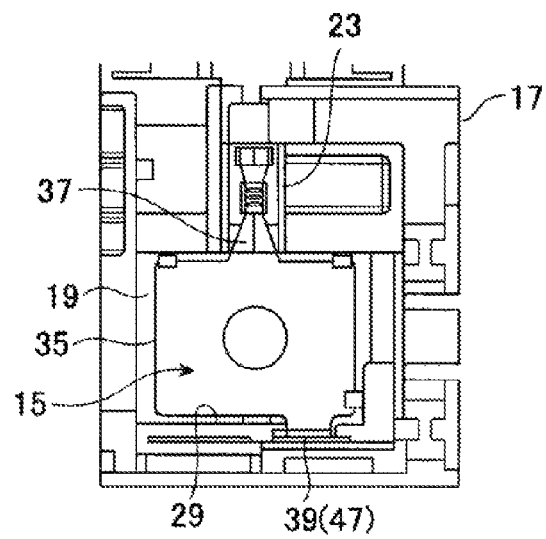
FIG. 3 is a plan view illustrating a state where the voltage detecting terminal illustrated in FIG. 2 is supported by a plate.

As illustrated in FIG. 3, as the bent portion 39 (holding portion 47) is held by the first surrounding wall 29 of the first housing portion 19 of the plate 17 and the crimping portion 37 is housed in the second housing portion 23, the voltage detecting terminal 15 is held by the plate 17.

Figure 4:
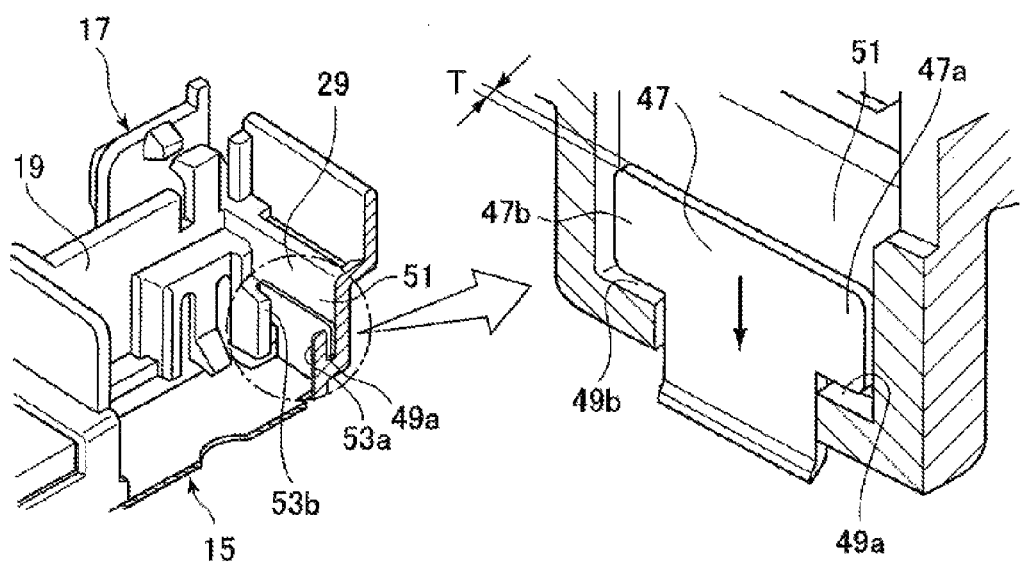
FIG. 4 is a partially broken perspective view and an essential portion enlarged view illustrating a state where the voltage detecting terminal illustrated in FIG. 3 is supported by the plate.

As illustrated in FIG. 4, one side surface of the first surrounding wall 29 is formed with a supporting surface 49a against which one holding portion end 47a in the bent portion 39 of the voltage detecting terminal 15 abuts, and a supporting surface 49b against which the other holding portion end 47b abuts. The supporting surfaces 49a and 49b are provided so as to protrude from a lateral wall 51 of the first surrounding wall 29 toward the inside of the first housing portion 19, and a gap in which the trunk portion 45 of the voltage detecting terminal 15 is housed is provided between the supporting surfaces 49a and 49b. Additionally, the first housing portion 19 is provided with a lateral wall 53b that rises parallel to the lateral wall 51 with the supporting surface 49a therebetween, and a lateral wall 53a that rises parallel to the lateral wall 51 with the supporting surface 49b therebetween.

Next, the operation when the voltage detecting terminal 15 is assembled to the plate 17 will be described.

As the bent portion 39 of the voltage detecting terminal 15 is incorporated along the lateral wall 51 of the first housing portion 19, the electric contact portion 35 is housed in the first housing portion 19. In this case, one holding portion end 47a formed at the bent portion 39 is housed in a U-shaped cross-sectional space surrounded by the supporting surface 49a, the lateral wall 51, and the lateral wall 53a, and the other holding portion end 47b is housed in a U-shaped cross-sectional space surrounded by the supporting surface 49b, the lateral wall 51, and the lateral wall 53b. Then, if the voltage detecting terminal 15 is incorporated to a predetermined position of the plate 17, lower end surfaces of plate thickness portions of the holding portion ends 47a and 47b in the holding portion 47 abut against the supporting surfaces 49a and 49b of the plate 17, respectively. Meanwhile, the crimping portion 37 is housed in the second housing portion 23, and abuts against a bottom surface of the second housing portion 23. Accordingly, since the holding portion 47 and the crimping portion 37 are supported, respectively, the voltage detecting terminal 15 is held by the plate 17 in a state where the electric contact portion 35 is housed in the first housing portion 19.

Additionally, since the holding portion ends 47a and 47b in the bent portion 39 of the voltage detecting terminal 15 are arranged between the two lateral walls 51 and 53, respectively, the rattling of the voltage detecting terminal 15 can be suppressed.

Figure 5:
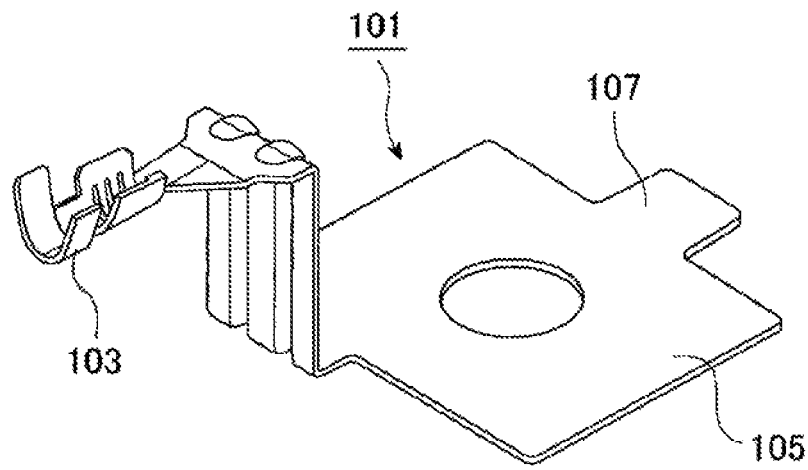
FIG. 5 is a perspective view of a related-art voltage detecting terminal.
Figure 6:
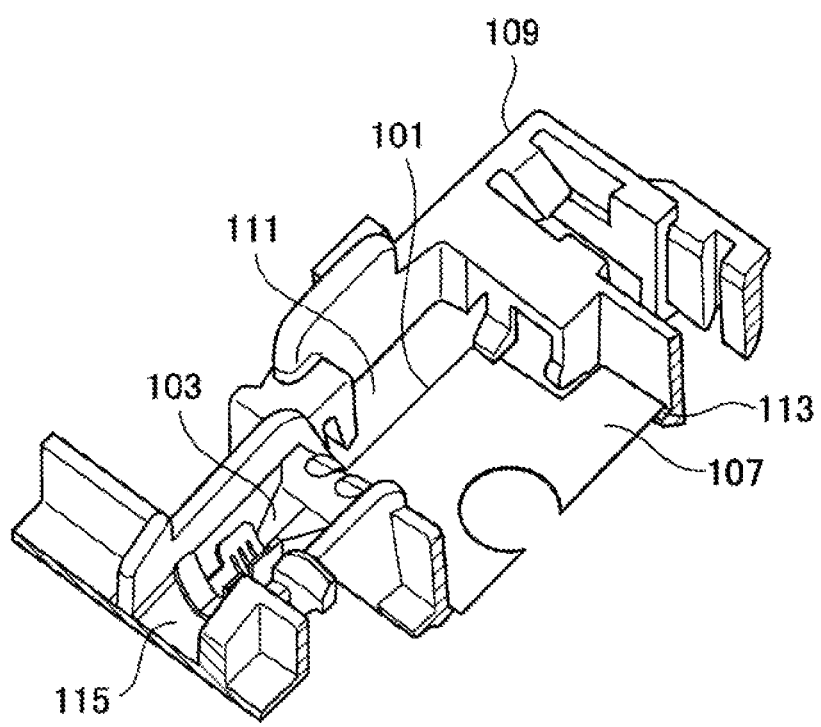
FIG. 6 is a partially broken perspective view illustrating a state where the voltage detecting terminal illustrated in FIG. 5 is supported by a plate.

Additionally, in the present embodiment, the thickness portions of the holding portion ends 47a and 47b in the voltage detecting terminal 15 are supported by the supporting surfaces 49a and 49b of the plate 17. Therefore, a space equivalent to a thickness T (refer to FIG. 4) within the first housing portion 19 only has to be secured for the supporting surfaces. Accordingly, the supporting surfaces 49a and 49b of the present embodiment can be markedly reduced in area compared to the related-art supporting surface 113 that supports the holding portion 107 that is connected to the electric contact portion 105 and extends in the planar direction, for example, as illustrated in FIGS. 5 and 6. Accordingly, since the plate itself can be made small, the amount of resin to be used for molding the plate 17 can be reduced, and part costs can be reduced. Additionally, the degree of freedom in the design of the plate 17 can be improved by making the space between the supporting surfaces 49a and 49b of the plate 17 small in this way.

Although the embodiment of the invention has been described above in detail with reference to the drawings, the above embodiment is merely illustrative of the invention, and the invention is not limited only to the configuration of the above embodiment. It is natural that even design changes or the like within a range that do not depart from the concept of the invention are included in the invention.

For example, as for the voltage detecting terminal 15, an example in which the bent portion 39 and the crimping portion 37 are respectively provided at two sides that are not adjacent to each other among four sides formed with the electric contact portion 35 has been described in the present embodiment. However, the invention is not limited to this. For example, the bent portion 39 and the crimping portion 37 may be respectively provided at two sides that are adjacent to each other.

Additionally, as for the voltage detecting terminal 15, an example in which the bent portion 39 is bent substantially at a right angle to the electric contact portion 35 has been described in the present embodiment. However, the bending angle θ of the bent portion 39 (refer to FIG. 2) is not limited to the right angle, and may be set to an acute angle.

Here, the features of the embodiment of the structure for holding a voltage detecting terminal related to the above-described invention will be briefly summarized and listed below, respectively.

A structure for holding a voltage detecting terminal 15 in which a voltage detecting terminal 15 measuring the voltage of each battery is held by housing portions (a first housing portion and a second housing portion) 19 and 23 of a plate 17 made of resin in which busbars 13 connecting a plurality of batteries in series are housed, wherein the voltage detecting terminal 15 includes a flat plate-shaped electric contact portion 35 having an insertion hole 33 into which an electrode column of the battery is inserted, and is electrically connected to the electrode column, and a plate-shaped bent portion 39 formed such that a tip protruding so as to be connected to the electric contact portion 35 is bent upward with respect to the electric contact portion 35, wherein the bent portion 39 is provided with a holding portion 47, both ends of the holding portion 47 in a plate width direction are expanded in the plate width direction, respectively, and wherein the voltage detecting terminal 15 has a lower end surface of the holding portion 47 in a thickness direction abutting against supporting surfaces 49a and 49b of the plate 17 and is held by the housing portions (the first housing portion and the second housing portion) 19 and 23.

The structure for holding a voltage detecting terminal 15 of the configuration of the above, wherein the holding portion 47 is housed within a space formed between the supporting surfaces 49a and 49b and a pair of lateral walls 51 and 53a; 51 and 53b that rise parallel to each other with the supporting surfaces 49a and 49b therebetween.

The structure for holding a voltage detecting terminal 15 of the configuration of the above or, wherein the bent portion 39 is formed by being bent substantially at a right angle with respect to the electric contact portion 35.

Additionally, the present application is based on Japanese Patent Application (Patent Application No. 2012-189898) filed on Aug. 30, 2012, the content of which is incorporated herein by way of reference.

According to the structure for holding a voltage detecting terminal of the invention, since the plate can be downsized, part costs can be reduced.

What is claimed is:

1. A structure for holding a voltage detecting terminal in which a voltage detecting terminal measuring a voltage of each battery is held by a housing portion of a plate made of resin in which busbars connecting a plurality of batteries in series are housed, wherein the voltage detecting terminal includes:
a flat plate-shaped electric contact portion having an insertion hole into which an electrode column of the battery is inserted, and is electrically connected to the electrode column, and a plate-shaped bent portion formed such that a tip protruding so as to be connected to the electric contact portion is bent upward with respect to the electric contact portion, wherein the bent portion is provided with a trunk portion at a base end and a holding portion at the opposite distal end, and both ends of the holding portion in a plate width direction are expanded beyond a width of the trunk portion in the plate width direction, respectively, such that the trunk portion and the holding portion combine to form a T-shape, and wherein the voltage detecting terminal has a lower end surface of the expanded holding portion in a thickness direction thereof abutting against a supporting surface of the plate and is held by the housing portion.

2. The structure for holding a voltage detecting terminal according to claim 1, wherein the holding portion is housed within a space formed between the supporting surface and a pair of lateral walls that rise parallel to each other with the supporting surface between and adjacent to the lateral walls.

3. The structure for holding a voltage detecting terminal according to claim 1, wherein the bent portion is formed by being bent substantially at a right angle with respect to the electric contact portion.

4. A structure for holding a voltage detecting terminal for measuring a voltage of a first battery, comprising:

a plate made of resin including a housing portion for holding the voltage detecting terminal via a holding portion;

a busbar, housed within the housing portion, configured to electrically connect the first battery in series with a second battery;

wherein the voltage detecting terminal includes:
a flat plate-shaped electric contact portion configured to electrically connect to an electrode column of the first battery, the electric contact portion having an insertion hole formed for insertion of the electrode column of the first battery therein, and a plate-shaped bent portion connected to the electric contact portion and bent upward with respect to the electric contact portion at a distance away from the electric contact portion, wherein the bent portion is provided with a trunk portion at a first end and a holding portion at the opposite end, and both ends of the holding portion in a plate width direction are expanded beyond both ends of the trunk portion in the plate width direction, respectively, such that the trunk portion and the holding portion combine to form a T-shape, and wherein a lower end surface of the holding portion abuts against a supporting surface of the plate in a thickness direction of the holding portion.

5. The structure for holding a voltage detecting terminal according to claim 4, wherein the housing portion holds the holding portion within a space formed between the supporting surface and a pair of lateral walls that rise parallel to each other with the supporting surface between and adjacent to the lateral walls.

6. The structure for holding a voltage detecting terminal according to claim 4, wherein the bent portion is formed by being bent substantially at a right angle with respect to the electric contact portion.

7. A voltage detecting terminal for measuring a voltage of a battery comprising:

a flat plate-shaped electric contact portion configured to electrically connect to an electrode column of the battery, the electric contact portion having an insertion hole formed for insertion therein of the electrode column of the battery, and a plate-shaped bent portion connected to the electric contact portion and bent upward with respect to the electric contact portion at a distance away from the electric contact portion, wherein the bent portion is provided with a trunk portion at a first end and a holding portion at the opposite end, and both ends of the holding portion in a plate width direction are expanded beyond both ends of the trunk portion in the plate width direction, respectively, such that the trunk portion and the holding portion combine to form a T-shape.

8. The voltage detecting terminal according to claim 7, wherein the bent portion is formed by being bent substantially at a right angle with respect to the electric contact portion.

* * * * *